United States Patent
Aoyagi et al.

(10) Patent No.: US 6,453,679 B1
(45) Date of Patent: Sep. 24, 2002

(54) DEHUMIDIFIER AND CONTROL SYSTEM FOR A DISK DRIVE

(75) Inventors: Akihiko Aoyagi, Fujisawa (JP); Kohki Noda, Fujisawa (JP); Mark I. Lutwyche, Adliswil (CH); Peter Vettiger, Langnau (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/712,592

(22) Filed: Nov. 14, 2000

(30) Foreign Application Priority Data

Jan. 5, 2000 (JP) ........................................ 2000-000193

(51) Int. Cl.[7] ............................................. F25B 21/02
(52) U.S. Cl. ................. 62/3.4; 62/281; 62/279
(58) Field of Search ..................... 62/3.4, 3.3, 3.6, 62/457.9, 171, 271, 92, 247, 249, 281, 279; 361/687, 688

(56) References Cited

U.S. PATENT DOCUMENTS

| 4,163,373 A | * | 8/1979 | van der Sluijs | ............ 62/279 X |
| 5,827,424 A | * | 10/1998 | Gillis et al. | ................. 62/3.4 X |
| 5,884,486 A | * | 3/1999 | Hughes et al. | ................. 62/3.4 |
| 6,158,224 A | * | 12/2000 | Hu et al. | ....................... 62/3.4 |

FOREIGN PATENT DOCUMENTS

| JP | 407167454 A | * | 7/1995 |
| JP | 10226501 A | * | 8/1998 |

* cited by examiner

Primary Examiner—Chen-Wen Jiang
(74) Attorney, Agent, or Firm—Robert B. Martin; Bracewell & Patterson, L.L.P.

(57) ABSTRACT

To provide a dehumidification apparatus which can perpetually maintain the internal humidity of a disk drive low and can be installed on a cover or the like of the disk drive with a small space. Also, the dehumidification apparatus is controlled based on the internal humidity or the temperature condition inside and outside the disk drive, by which stable dehumidification can be effected without condensation etc. occurring inside and outside of the disk drive. There are provided a glass fiber which is arranged penetrating a cover of a hard disk drive (HDD) and extends inside and outside the HDD, and a heating member provided outside the HDD, so that the glass fiber on the outside is bonded to the heating member and is heated. Also, a cooling member is provided inside the HDD, and the glass fiber on the inside is bonded to the cooling member. Also, there is provided an apparatus for circulating air that is in contact with a heating portion and a cooling portion.

7 Claims, 8 Drawing Sheets

DEHUMIDIFIER AND CONTROL SYSTEM FOR A DISK DRIVE

BACKGROUND OF THE INVENTION

1. Technical Field

The present invention relates to a dehumidification apparatus for reducing the humidity in a closed housing for a hard disk etc. and, more particularly, to a microminiature dehumidification apparatus suited for installation on a cover of a hard disk drive (hereinafter referred to as an HDD), and a dehumidification control system.

2. Description of the Related Art

As a method for keeping the humidity in a hard disk drive low, a conventional method has been used in which a desiccant is arranged in the hard disk drive. Thus, an improved and modern dehumidification system, including means to control the dehumidifying process, would be desirable.

SUMMARY OF THE INVENTION

Since a desiccant loses its hygroscopic property after it has absorbed a predetermined amount of water, it cannot keep the humidity in the HDD low for a long period of time. Further, water absorbed once by the desiccant is released again in the HDD for a long time, so that corrosion of the device in the HDD cannot be prevented from occurring from a long-term viewpoint.

An object of the present invention is to provide a microminiature, simply-constructed dehumidifier for removing water in a highly airtight device such as an HDD, a humidifier system in which an air circulation mechanism is added to the humidifier, and a dehumidification control system for keeping the interior of the device at a predetermined humidity or lower by controlling the dehumidifier and the dehumidification apparatus.

The dehumidifier in accordance with the present invention comprises a capillary member which is disposed penetrating a wall for forming two separated spaces so that a first portion thereof is located in one space and a second portion thereof is located in the other space, and the first portion and second portion are connected to each other, by which water can be moved between the two spaces by capillary action or phenomenon; and a heating portion for heating the first portion.

In this case, there may be provided a cooling portion for cooling the second portion of the capillary member.

Further, the construction may be such that the heating portion and cooling portion are heated and cooled, respectively, by the Peltier effect.

The dehumidification apparatus in accordance with the present invention comprises a first air circulator comprising a circulation pipe forming a circulation passage for air; and a pair of air feeders each of which is arranged at both ends of the circulation pipe so that air is fed in the same direction of the circulation passage and an air hole is closed at the time of non-operation; and a dehumidifier comprising a heating portion formed in the circulation pipe; and a capillary member which is disposed penetrating a wall of the circulation pipe so that a first portion thereof is located inside the circulation pipe and a second portion thereof is located outside the circulation pipe while being connected to the first portion, by which water can be moved between the inside and the outside of the circulation pipe by the capillary phenomenon; the first portion of the capillary member located on the inside being heated by the heating portion.

In this case, a cooling portion may be formed outside the circulation pipe so that the second portion of the capillary member is cooled by the cooling portion.

The dehumidification apparatus of another construction comprises first and second air circulators each comprising a circulation pipe forming a circulation passage for air; and a pair of air feeders each of which is arranged at both ends of the circulation pipe so that air is fed in the same direction of the circulation passage and an air hole is closed at the time of non-operation; and a dehumidifier comprising a heating portion formed in the first circulation pipe; and a capillary member in which a first portion and a second portion thereof are located so as to be connected to the inside of the first and second circulation pipes, respectively, by which water can be moved between the inside portions of both of the circulation pipes by capillary action or phenomenon; the first portion of the capillary member located inside the first circulation pipe being heated by the heating portion.

In this case, a cooling portion may be formed inside the second circulation pipe so that the second portion of the capillary member is cooled by the cooling portion.

The disk drive in accordance with the present invention comprises a housing formed with a pair of air holes; and the aforementioned dehumidification apparatus, and is constructed so that, of the pair of air feeders of the first air circulator, an air inflow port of the air feeder through which air flows into the circulation passage and an air outflow port of the air feeder through which air flows out of the circulation passage are spatially connected directly to each of the pair of air holes.

The disk drive of another construction comprises a housing formed with a pair of air holes; and the dehumidification apparatus having a pair of air feeders, and is constructed so that an air outflow port of the air feeder through which air flows out of the circulation passage, of the pair of air feeders of the first air circulator, and an air inflow port of the air feeder through which air flows into the circulation passage, of the pair of air feeders of the second air circulator, are spatially connected directly to each of the pair of air holes.

The dehumidification control system in accordance with the present invention has, in addition to the aforementioned disk drive, a humidity sensor disposed in the housing and a controller for controlling the dehumidification apparatus so that the dehumidification apparatus is operated when the humidity in the housing has a value not lower than a predetermined value.

The dehumidification control system of another construction has, in addition to the aforementioned disk drive, a pair of temperature sensors disposed inside and outside the housing and a controller for controlling the dehumidification apparatus so that the dehumidification apparatus is operated based on the temperatures inside and outside the housing.

DETAILED DESCRIPTION OF THE PREFERRED EMBODIMENT

Figure 1:
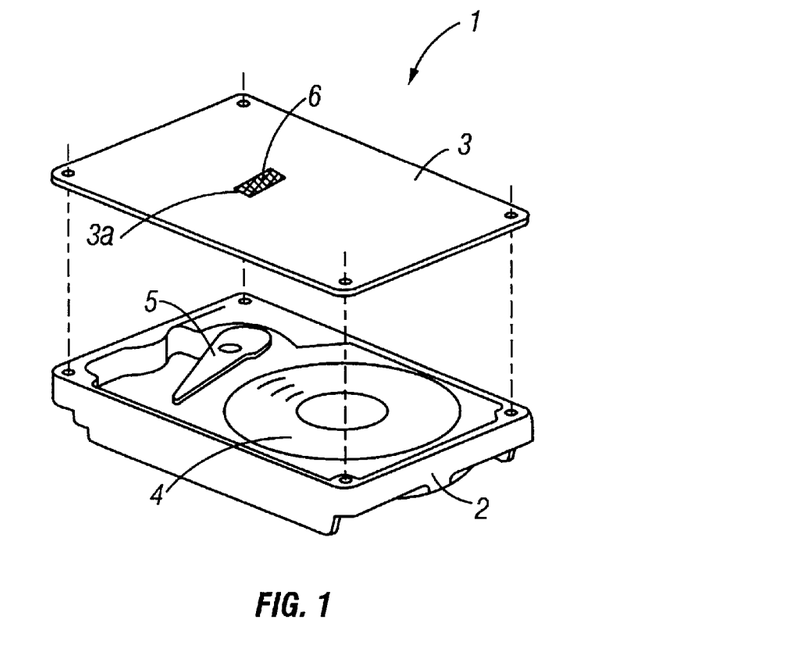
FIG. 1 is a perspective view showing an embodiment of an HDD constructed in accordance with the present invention.

FIG. 1 is a perspective view showing an embodiment of an HDD in accordance with the present invention. An HDD 1 comprises a disk 4, a base 2 for arranging an actuator arm 5 etc. at predetermined positions therein, and a cover 3 which is formed by an aluminum or stainless steel plate etc. and is installed above the base 2, by which a substantially closed housing is formed. In this cover 3 is formed a dehumidifier 6.

To make the construction clear, FIG. 1 shows a state in which the cover 3 is removed and moved in the direction away from the base 2.

Figure 2:
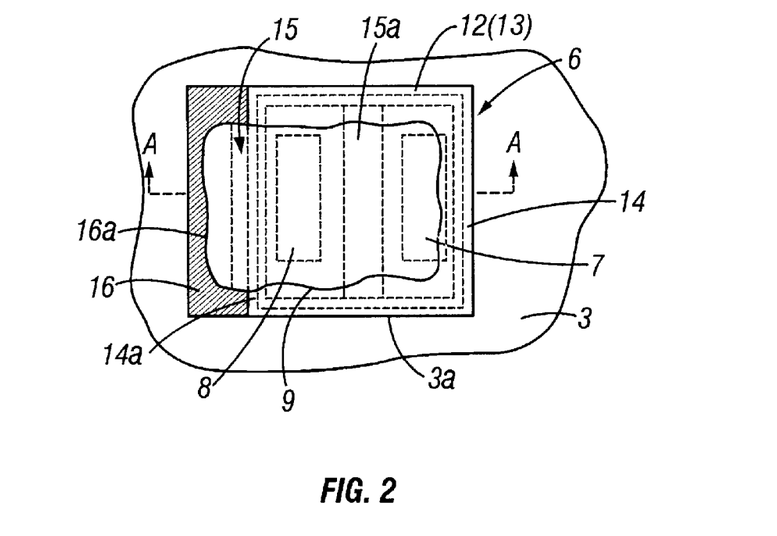
FIG. 2 is a top view showing a construction of an embodiment of a dehumidifier in accordance with the present invention.
Figure 3:
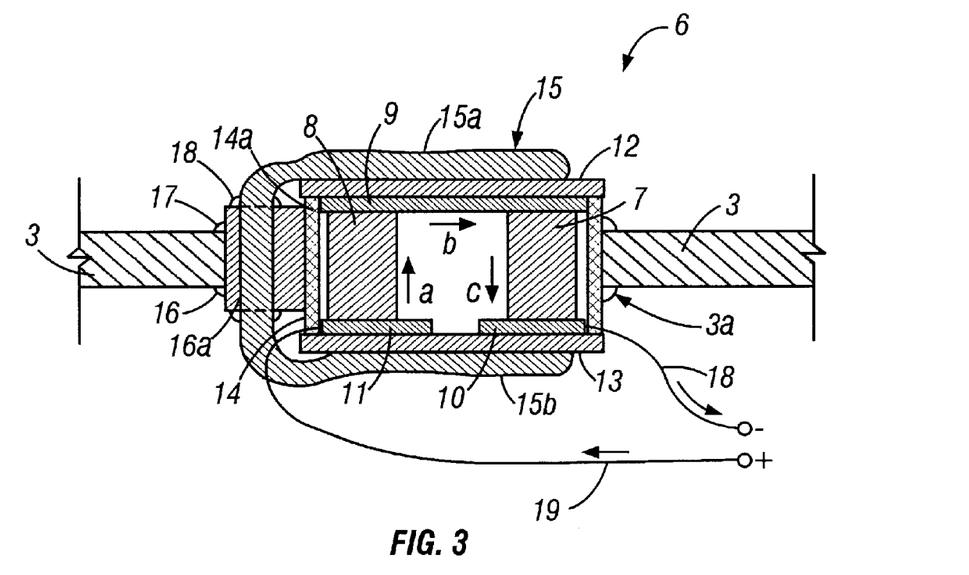
FIG. 3 is a sectional view taken along the line A—A of the top view of FIG. 2.

FIG. 2 is a top plan view showing a construction of an embodiment of a dehumidifier 6 in accordance with the present invention. FIG. 3 is a sectional view taken along the line A—A of FIG. 2.

The dehumidifier 6 is inserted and positioned in an opening 3a formed in the cover 3 of the HDD 1. One end of each of a prismatic n-type semiconductor 7 and p-type semiconductor 8, which are components of the dehumidifier 6, joins to the lower surface of a metallic conductive plate 9. The other end of the n-type semiconductor 7 joins to the upper surface of a minus metal plate terminal 10, and the other end of the p-type semiconductor 8 joins to the upper surface of a plus metal plate terminal 11.

The upper surface of the metallic conductive plate 9 joins to the lower surface of a heating plate 12 formed of a ceramic, and the lower surface of the minus metal plate terminal 10 and the plus metal plate terminal 11 each joins to the upper surface of a cooling plate 13 formed of a ceramic. Side plates 14 form four sides so as to form a rectangular parallelepiped whose upper and lower faces are the heating plate 12 and the cooling plate 13, respectively, which are opposed to each other at a predetermined interval in the vertical direction.

On one side face 14a of the side plate 14 is disposed a glass fiber holding member 16. The glass fiber holding member 16 is formed with an elongated hole 16a along one side face of the side plate 14. A glass fiber 15, the amount of which is of such a degree as to close the elongated hole 16a, is arranged in such a state as to connect to the upper and lower sides of the glass fiber holding member 16 via the elongated hole 16a. The glass fiber 15 on the upside of the glass fiber holding member 16 is bent so as to extend along the heating plate 12, and is bonded to the upper surface of the heating plate 12. The glass fiber 15 on the downside of the glass fiber holding member 16 is bent so as to extend along the cooling plate 13, and is bonded to the lower surface of the cooling plate 13.

The dehumidifier 6 constructed as described above is inserted and positioned in the opening 3a formed in the cover 3 of the HDD 1 (FIG. 1), and further is fixed with an adhesive 17 packed to keep airtightness. To prevent a gap from being produced between the glass fiber 15 and the elongated hole 16a, an adhesive should preferably be packed therebetween for fixation to such a degree that the adhesive does not permeate in the glass fiber 15 to hinder the capillary phenomenon, described later. Also, the housing consisting of the cover 3 and the base 2 (FIG. 1) and the member for closing the opening 3a correspond to a wall for separating two spaces.

In the above described configuration, when a predetermined voltage is applied to between the minus metal plate terminal 10 and the plus metal plate terminal 11 via lead wires 18 and 19, an electric current flows in a circuit formed by the plus metal plate terminal 11, the p-type semiconductor 8, the metallic conductive plate 9, the n-type semiconductor 7, and the minus metal plate terminal 10 in the direction indicated by arrows a, b and c shown in FIG. 3.

At this time, as is known as the Peltier effect, the absorption and generation of heat take place at a junction of the plus metal plate terminal 11 and the p-type semiconductor 8, a junction of the p-type semiconductor 8 and the metallic conductive plate 9, a junction of metallic conductive plate 9 and the n-type semiconductor 7, and a junction of the n-type semiconductor 7 and the minus metal plate terminal 10. As a result, the plus metal plate terminal 11 and the minus metal plate terminal 10 are cooled, and the metallic conductive plate 9 is heated.

Therefore, inside the HDD 1 (FIG. 1), the cooling plate 13 that is in contact with the plus metal plate terminal 11 and the minus metal plate terminal 10 is cooled, so that water in the HDD 1 condenses on the cooling plate 13 and at an adsorbing portion 15b of the glass fiber 15 which is cooled by the contact with the cooling plate 13. The water condensing at the adsorbing portion 15b moves successively in the glass fiber 15 toward the evaporating portion 15a by the capillary phenomenon.

On the other hand, outside the HDD 1 (FIG. 1), the heating plate 12 that is in contact with the metallic conductive plate 9 is heated, so that the water reaching the evaporating portion 15a of the glass fiber 15 that is in contact with the heating plate 12 is evaporated successively by this heat. Thus, the water in the HDD 1 is removed to the outside thereof.

As described above, according to the dehumidifier 6 in accordance with an embodiment of the present invention, the water in the HDD 1 can be discharged efficiently to the outside only by using a simple construction and a small space.

Figure 4:
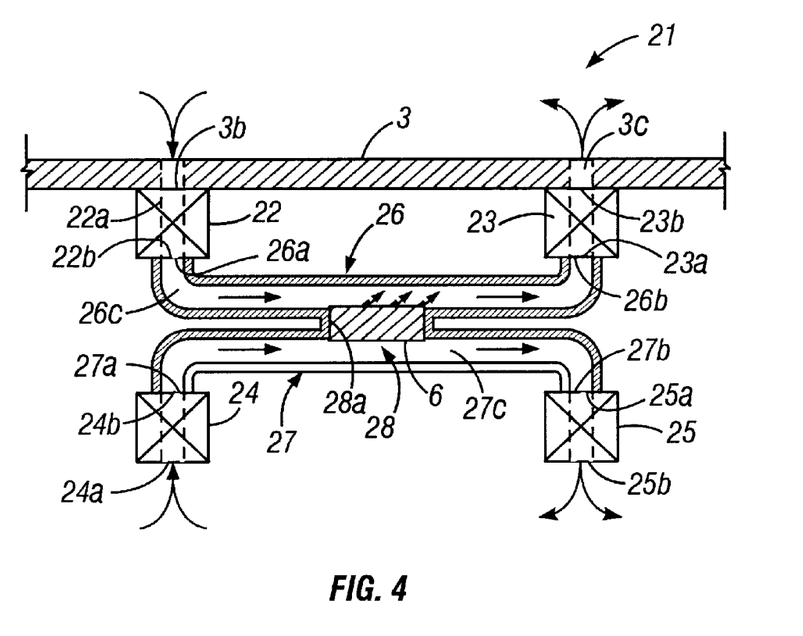
FIG. 4 is a sectional view showing a construction of an embodiment of a dehumidification apparatus in accordance with the present invention.

FIG. 4 is a sectional view showing a construction of an embodiment of a dehumidification apparatus in accordance with the present invention.

This dehumidification apparatus 21 is, like, for example, the aforementioned dehumidifier 6 (FIG. 3), installed on the cover 3 of the HDD 1 shown in FIG. 1. In this case, the cover 3 is formed with a suction hole 3b and an exhaust hole 3c. These holes are closely connected to an inlet hole 22a of a micropump 22, described later, and an outlet hole 23b of a micropump 23, respectively, in an airtight condition inside the cover.

One end 26a of an outside air circulation pipe 26 is closely connected to the peripheral portion of the outlet hole 22b of the micropump 22, and the other end 26b thereof is closely connected to the peripheral portion of the inlet hole 23a of the micropump 23. Therefore, a circulation passage 26c of the outside air circulation pipe 26 communicates with the outside of the HDD 1 via the micropump 22 or the micropump 23.

One end 27a of an inside air circulation pipe 27 is closely connected to the peripheral portion of an outlet hole 24b of a micropump 24, and the other end 27b thereof is closely connected to the peripheral portion of an inlet hole 25a of a micropump 25. An inlet hole 24a of the micropump 24 and an outlet hole 25b of the micropump 25 are located in the HDD 1. Therefore, a circulation passage 27c of the inside air circulation pipe 27 communicates with the inside of the HDD 1 via the micropump 24 or the-micropump 25.

The circulation passage 26c of the outside air circulation pipe 26 and the circulation passage 27c of the inside air circulation pipe 27 are spatially connected via a connection hole 28 formed at the central portion of these passages. In this connection hole 28, the aforementioned dehumidifier 6 shown in FIG. 2 is inserted and fixed with no gap in such a manner that the heating plate 12 (FIG. 3) faces the circulation passage 26c.

Figure 5:
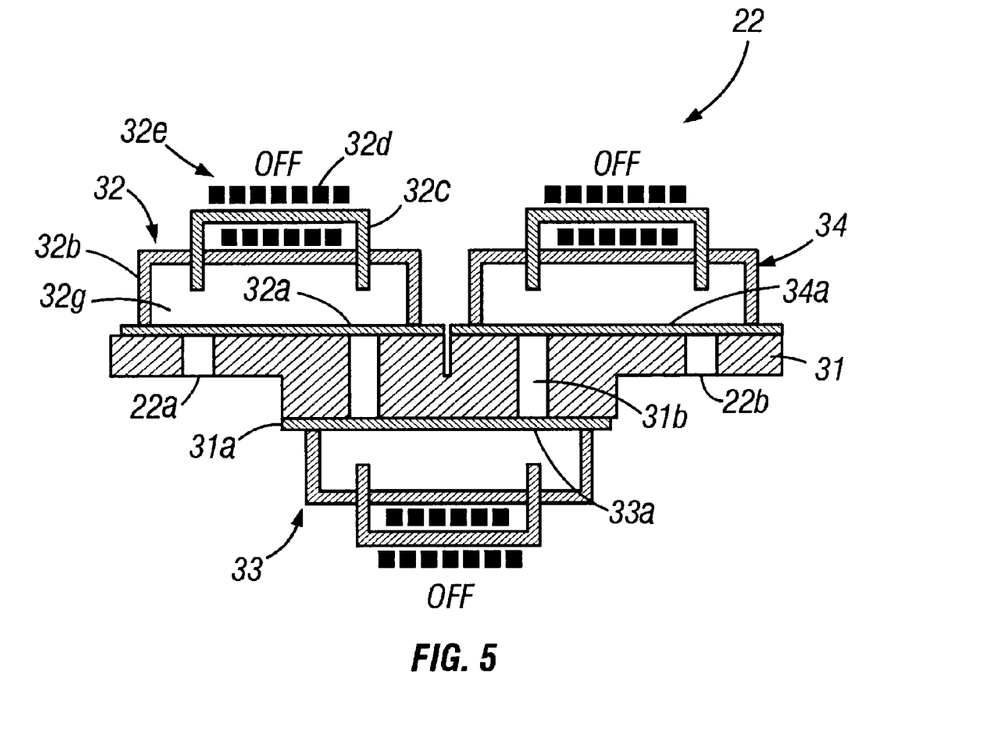
FIG. 5 is a sectional view showing a construction of a micropump.

Since the micropumps 22, 23, 24 and 25 have the same construction though the operation timing thereof is different, only the internal construction of the micropump 22 is shown in FIG. 5 as an example, and the operation thereof will be described with reference to an operation view of FIG. 6.

As shown in FIG. 5, the micropump 22 comprises a base 31 and three microvalves 32, 33 and 34 disposed at predetermined positions of the base 31. The base 31 is formed with the inlet hole 22a of the micropump 22, which corresponds to an air inlet, the outlet hole 22b of the micropump 22, which corresponds to an air outlet, and passage holes 31a and 31b which constitute intermediate passages of air.

The microvalves 32, 33 and 34 have the same construction though the operation timing thereof is different, and therefore only the construction of the microvalve 32 is explained. Other microvalves 33 and 34 will be explained in the later description of operation as necessary.

The microvalve 32 comprises a soft magnet film 32a, which is placed on the base 31 so as to close the inlet hole 22a and one of openings of the passage hole 31a of the base 31, a passage cover 32b, which forms a space 32g for allowing the soft magnet film 32a to be deformed so that the inlet hole 22a is spatially connected to the passage hole 31a as described later, and a core 32c, which forms an electromagnet 32e by winding a coil 32d and is disposed so as to be close to the soft magnet film 32a with both end portions thereof projecting into the space 32g.

Similarly, the microvalve 34 is constructed so that the soft magnet film 34a thereof is disposed so as to close the outlet hole 22b and one opening of the passage hole 31b of the base 31, and the microvalve 33 is constructed so that the soft magnet film 33a thereof is disposed so as to close the other opening of the passage hole 31a and the passage hole 31b of the base 31.

Figure 6A:
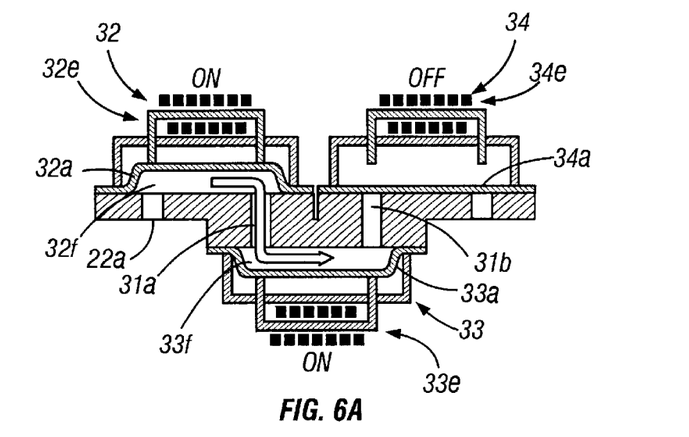
FIGS. 6(a)–(c) are sectional views showing various states of operation of the micropump of FIG. 5.

In the above described construction, when the electromagnet 32e of the microvalve 32 is first turned on, the soft magnet film 32a is attracted by the electromagnet 32e and is curved as shown in FIG. 6(a), so that the inlet hole 22a and the passage hole 31a are connected spatially to each other, and therefore air entering through the inlet hole 22a flows into a variable space 32f formed in the microvalve 32. Next, after the electromagnet 33e of the microvalve 33 is turned on, the electromagnet 32e of the microvalve 32 is turned off, by which the inflow air is caused to flow into a variable space 33f of the microvalve 33.

Figure 6B:
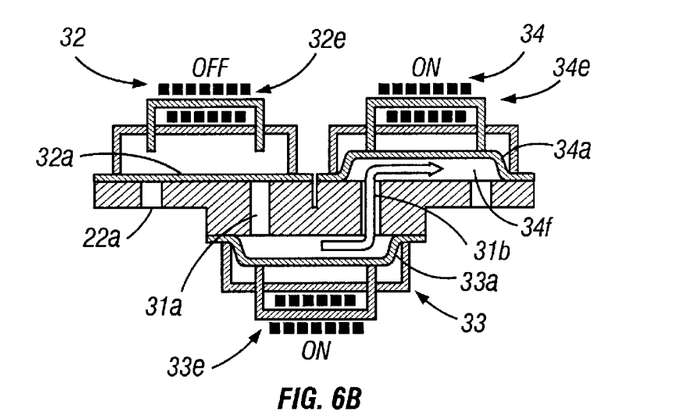
Figure 6C:
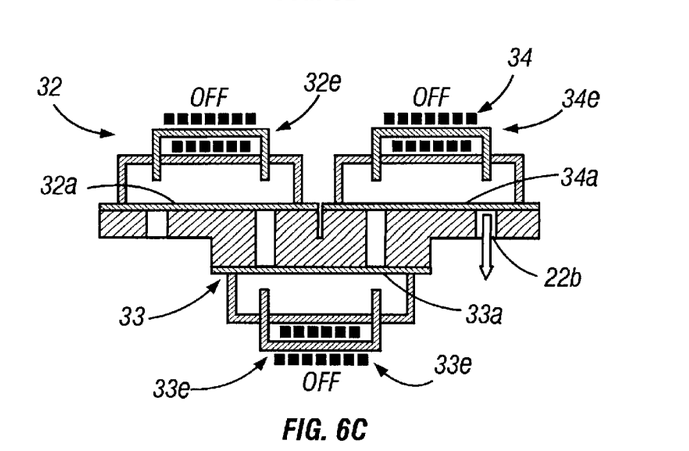

Next, after the electromagnet 34e of the microvalve 34 is turned on, the electromagnet 33e of the microvalve 33 is turned off, by which the inflow air is further caused to flow into a variable space 34f of the microvalve 34 as shown in FIG. 6(b). Finally, the electromagnet 34e of the microvalve 34 is turned off, by which the air having flowed in through the inlet hole 22a is discharged through the outlet hole 22b as shown in FIG. 6(c).

By continuously repeating a series of the above described operations, the micropump 22 can always discharge, through the outlet hole 22b, the air having flowed in through the inlet hole 22a. The state in which the micropump sends air by an interlocked operation of three microvalves in this manner is hereinafter referred to simply as an operating condition of micropump.

The dehumidification apparatus 21 (FIG. 4) forms a flow of air by operating the four micropumps 22, 23, 24 and 25 with the above described construction, and thereby dehumidifies the interior of the HDD 1 as described below.

When all of the micropumps 22, 23, 24 and 25 are turned into an operating condition, the outside air of the HDD 1 (FIG. 1) flows in the circulation passage 26c of the outside air circulation pipe 26 in the arrow-marked direction, and on the other hand, the inside air of the HDD 1 (FIG. 1) flows in the circulation passage 27c of the inside air circulation pipe 27 in the arrow-marked direction. In this state, the aforementioned predetermined voltage is applied to the metal plate terminals 10 and 11 (FIG. 3) of the dehumidifier 6, by which the water in the HDD 1 is discharged from the evaporating portion 15a of the glass fiber 15 into the circulation passage 26c.

As described above, according to the dehumidification apparatus 21 in accordance with an embodiment of the present invention, since new inside air and outside air are always supplied to the vicinity of the dehumidifier 6, dry inside air and wet outside air do not stay around the dehumidifier 6, thereby increasing the dehumidification efficiency. Also, since the inside air pressure is not decreased by the dehumidification, there is no fear of an adverse effect of a flying head etc. on the operation of HDD. Further, since the inlet and outlet holes of each of the micropumps are closed in the stopped state, the airtightness of HDD is maintained when the dehumidification apparatus 21 is not in operation.

Although the direction in which the inside air flows in the inside air circulation pipe 27 is the same as the direction in which the outside air flows in the outside air circulation pipe 26 in the construction shown in FIG. 4, these directions may be opposite to each other. Also, the outside and inside air circulation pipes 26 and 27 may be crossed obliquely or at right angles, not being in parallel.

Figure 7:
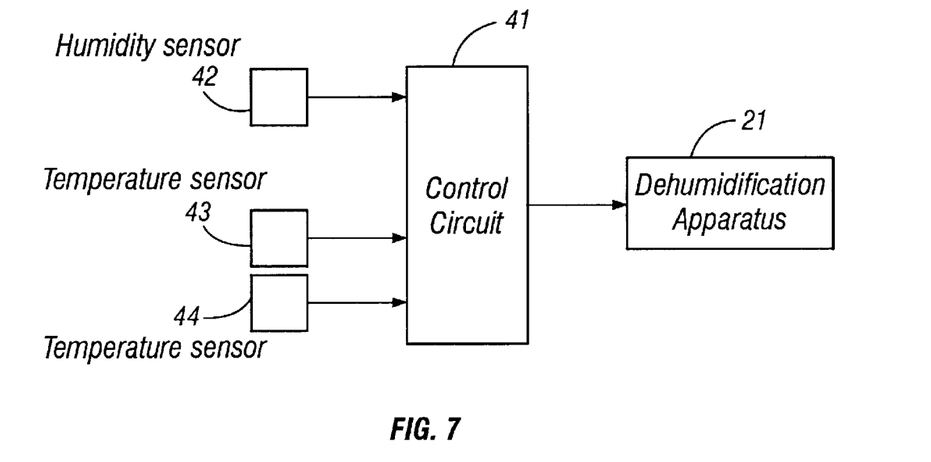
FIG. 7 is a block diagram showing an embodiment of a dehumidification control system in accordance with the present invention.
Figure 8:
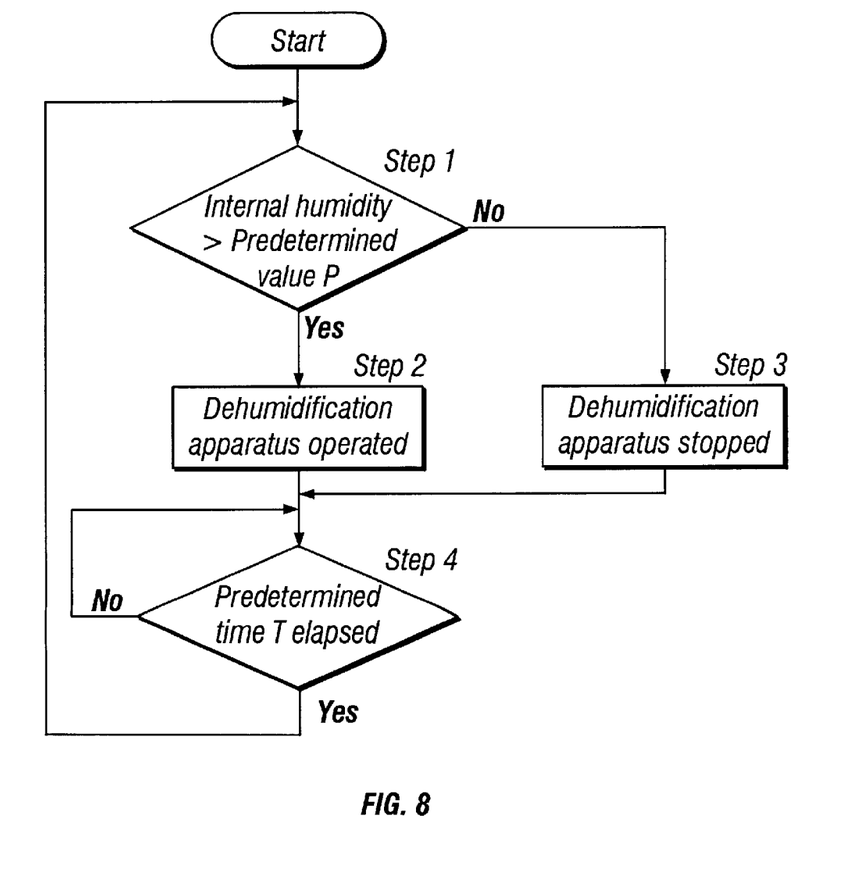
FIG. 8 is a flowchart for illustrating the operation of a control unit of the dehumidification control system.
Figure 9:
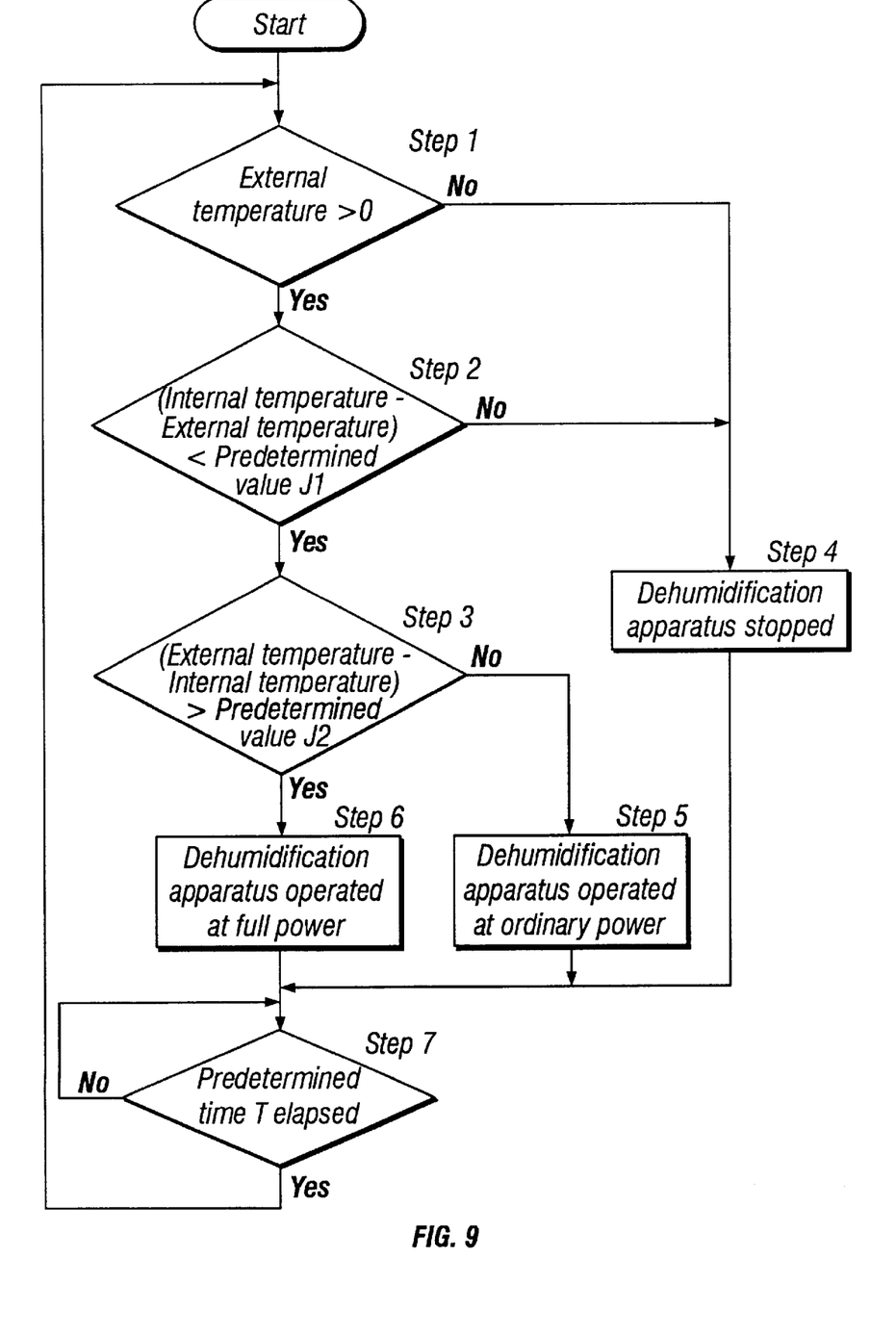
FIG. 9 is a flowchart illustrating the operation of a control unit of the dehumidification control system.

FIG. 7 is a block diagram showing a basic configuration of an embodiment of a dehumidification control system in accordance with the present invention. FIGS. 8 and 9 are flowcharts for illustrating the operation of a control unit for the dehumidification control system shown in FIG. 7.

In FIG. 7, a humidity sensor 42, which is disposed at a predetermined position (not shown) inside the HDD 1 (FIG.

1), sends out the humidity information in the HDD 1 to a control circuit 41. A temperature sensor 43, which is disposed at a predetermined position (not shown) outside the HDD 1, sends out the external temperature information outside the HDD 1 to a control circuit 41, and a temperature sensor 44, which is disposed at a predetermined position (not shown) inside the HDD 1, sends out the internal temperature information inside the HDD 1 to a control circuit 41. For simplifying the explanation, FIG. 7 shows the humidity sensor 42 and both of the temperature sensors 43 and 44. However, either one of the humidity sensor 42 and a pair of temperature sensors 43 and 44 may be disposed selectively according to the later-described operation mode.

FIG. 8 is a flowchart for a dehumidification control system that is provided with the humidity sensor 42 (FIG.7) inside the HDD 1. When the HDD 1 is turned on, the control circuit 41 checks whether or not the internal humidity in the HDD 1 exceeds a predetermined value P (Step 1). If the humidity exceeds the predetermined value P, the four micropumps 22, 23, 24 and 25 of the dehumidification apparatus 21 shown in FIG. 4 is made in the operating condition to circulate the outside air and the inside air through the circulation passages 26c and 27c, respectively, and also a predetermined voltage is applied to the pair of metal plate terminals 10 and 11 (FIG. 3) of the dehumidifier 6 to operate the dehumidification apparatus 21 (Step 2). On the other hand, if the internal humidity has a value equal to or lower than the predetermined value P, the dehumidification apparatus 21 is not operated (Step 3).

The control circuit 41 checks the humidity in the HDD 1 as described above each time that time T shown in Step 4 elapses, and operates or stops the dehumidification apparatus 21 according to the result.

FIG. 9 is a flowchart for a dehumidification control system that is, provided with the temperature sensors 43 and 44 inside and outside the HDD 1. When the HDD 1 is turned on, the control system 41 checks whether the external temperature is not higher than 0° C. (Step 1). If the external temperature is not higher than 0° C., the dehumidification apparatus 21 is kept stopped (Step 4). This operation is performed to prevent the water discharged into the circulation passage 26c of the outside air circulation pipe 26 from freezing in the passage.

Next, a difference between the external temperature and the internal temperature is checked, and if the external temperature is lower than the internal temperature by a predetermined value J1 or more, the dehumidification apparatus 21 is kept stopped (Steps 2 and 4). This operation is performed to prevent the water discharged to the outside from condensing near the exhaust hole 3c (FIG. 4) in the cover 3.

Next, a difference between the external temperature and the internal temperature is checked, and if the external temperature is higher than the internal temperature by a predetermined value J2 or more, the dehumidification apparatus 21 is operated at the highest efficiency set for emergency (Steps 3 and 6). This operation is performed to prevent the water in the HDD 1 from condensing inside. If the result of judgment in Step 2 is Yes and the result of judgment in Step 3 is No, the dehumidification apparatus 21 is operated at an efficiency set for normal operation (Steps 2, 3 and 5). The operation efficiency of the dehumidification apparatus 21 is determined by the speed value of operation timing of each micropump explained with reference to FIG. 6 and the voltage value applied to the dehumidifier 6, and is set appropriately.

Further, the control circuit 41 checks the temperatures inside and outside the HDD 1 as described above each time that time T shown in Step 7 elapses, and operates or stops the dehumidification apparatus 21 according to the result.

As described above, according to the dehumidification control system in accordance with an embodiment of the present invention, the humidity inside the HDD or the temperatures inside and outside the HDD are detected, and the operation of the dehumidification apparatus is controlled based on the result. Therefore, the interior of the HDD can be dehumidified in the best condition. Also, although the humidity control by the detection of humidity and the humidity control by the detection of temperature have been explained as a separate system in the above embodiment, a system in which both controls are combined may be configured. For example, the system configuration may be such that the humidity inside the HDD is checked, and if the humidity has a value not lower than the predetermined value P, the program proceeds to Step 1 in FIG. 9.

Figure 10:
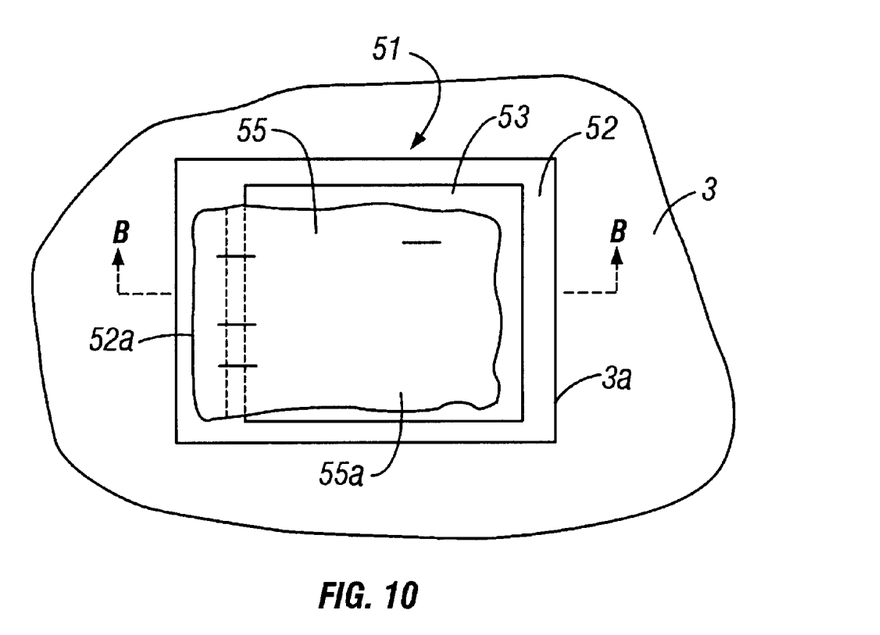
FIG. 10 is a top view showing a construction of another embodiment of a dehumidifier in accordance with the present invention.
Figure 11:
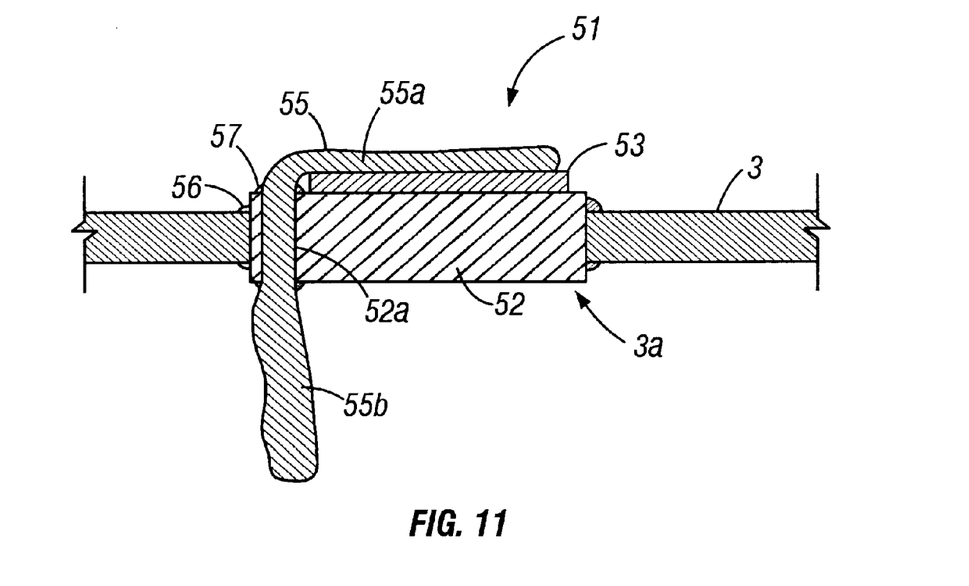
FIG. 11 is a sectional view taken along the line B—B of the top view of FIG. 10.

FIG. 10 is a top view showing a construction of another embodiment of a dehumidifier in accordance with the present invention, and FIG. 11 is a sectional view taken along the line B—B of FIG. 10.

This dehumidifier 51 is, like the aforementioned dehumidifier 6 shown in FIG. 3, inserted and positioned in the opening 3a formed in the cover 3 of the HDD 1 (FIG. 1). A partitioning plate 52, which is a component of the dehumidifier 51, is fitted in the opening 3a and fixed with no gap by using an adhesive 56 packed to keep airtightness. The partitioning plate 52 is formed with an elongated hole 52a along one side thereof, and a flat plate shaped heating member 53 is fixed to the top surface of the partitioning plate 52.

A glass fiber 55, the amount of which is of a degree such as to close the elongated hole 52a, is arranged in such a state as to connect to the upper and lower sides of the partitioning plate 52 via the elongated hole 52a.

The glass fiber 55 on the upside of the partitioning plate 52 is bent so as to extend along the heating member 53, and is bonded to the upper surface of the heating member 53. The glass fiber 55 on the downside of the partitioning plate 52 is free without being fixed.

To prevent a gap from being produced between the glass fiber 55 and the elongated hole 52a, an adhesive should preferably be packed therebetween for fixation to such a degree that the adhesive does not permeate in the glass fiber 55 to hinder the capillary phenomenon. Also, the housing consisting of the cover 3 and the base 2 (FIG. 1) and the partitioning plate 52 correspond to a wall for separating two spaces.

In the above described construction, when a voltage is applied to an electrode, not shown, of the heating member 53 to heat the heating member 53, the water contained in an evaporating portion 55a of the glass fiber 55 in contact with the heating member evaporates, so that the internal water adhering to an adsorbing portion 55b of the glass fiber 55 in the HDD 1 moves successively in the glass fiber 55 toward the evaporating portion 55a by the capillary phenomenon. Thus, the water in the HDD 1 is removed to the outside.

As described above, according to the dehumidifier 51 in accordance with the embodiment of the present invention, the water in the HDD 1 can be discharged to the outside by a simple construction. Also, the dehumidifier 51 can be used in place of the dehumidifier 6 in the aforementioned dehumidification apparatus 21 shown in FIG. 4, and further the dehumidification apparatus provided with the dehumidifier 51 can be used for the dehumidification control system in accordance with the present invention shown in FIG. 7. In this case, however, the control unit 41 controls the voltage applied to the electrode, not shown, of the heating member 53.

Figure 12:
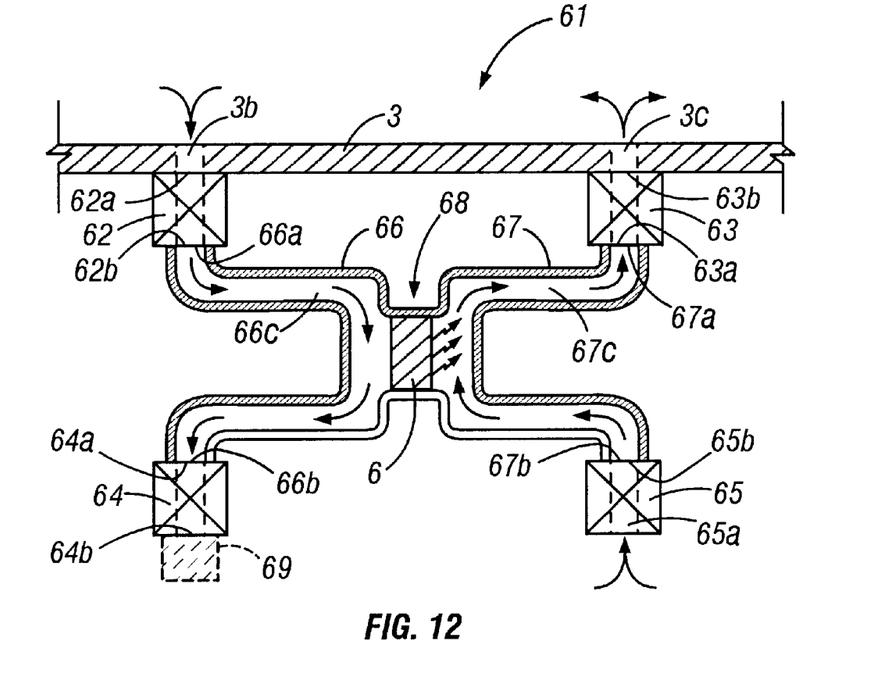
FIG. 12 is a sectional view showing a construction of another embodiment of a dehumidification apparatus in accordance with the present invention.

FIG. 12 is a sectional view showing a construction of another embodiment of a dehumidification apparatus in accordance with the present invention.

A dehumidification apparatus 61 is, like, for example, the aforementioned dehumidifier 6, installed on the cover 3 of the HDD 1 shown in FIG. 1. In this case, the cover 3 is formed with the suction hole 3b and the exhaust hole 3c. These holes are closely connected to an inlet hole 62a of a micropump 62 and an outlet hole 63b of a micropump 63, respectively, in an airtight condition inside the cover. Four micropumps 62, 63, 64 and 65 used in this embodiment are the same as the micropump 22 shown in FIG. 5. FIG. 12 shows the directivity of the disposed micropump by showing the inlet and outlet holes thereof.

One end 66a of an inflow pipe 66 is closely connected to the peripheral portion of an outlet hole 62b of the micropump 62, and the other end 66b thereof is closely connected to the peripheral portion of an inlet hole 64a of the micropump 64. On the other hand, one end 67a of an outflow pipe 67 is closely connected to the peripheral portion of an inlet hole 63a of the micropump 63, and the other end 67b thereof is closely connected to the peripheral portion of an outlet hole 65b of the micropump 65. Also, both of an output hole 64b of the micropump 64 and an inlet hole 65a of the micropump 65 are located in the HDD 1.

Therefore, a circulation passage 66c of the inflow pipe 66 communicates with the outside and inside of the HDD 1 via the micropumps 62 and 64, and a circulation passage 67c of the outflow pipe 67 communicates with the outside and inside of the HDD 1 via the micropumps 63 and 65.

The circulation passage 66c of the inflow pipe 66 and the circulation passage 67c of the outflow pipe 67 are connected spatially to each other by a connection hole 68 formed at the central portion of these passages. In this connection hole 68, the aforementioned dehumidifier 6 shown in FIG. 2 or the dehumidifier 51 shown in FIG. 10 is inserted and fixed with no gap. At this time, the dehumidifier is disposed so that the evaporating portion thereof is located on the side of the outflow pipe.

In the above construction, when all of the micropumps 62, 63, 64 and 65 are made in an operating condition, the outside air of the HDD 1 (FIG. 1) flows through the circulation passage 66c of the inflow pipe 66 in the arrow-marked direction, entering the HDD 1. On the other hand, the inside air of the HDD 1 (FIG. 1) flows through the circulation passage 67c of the outflow pipe 67 in the arrow-marked direction, flowing out to the outside of the HDD 1. When the aforementioned predetermined voltage is applied to the metal plate terminals 10 and 11 (FIG. 3) of the dehumidifier 6 in this state, the dehumidifier 6 absorbs water from the outside air flowing into the HDD 1 through the circulation passage 66c and discharges the water into the inside air flowing out to the outside of the HDD 1 through the circulation passage 67c.

Therefore, water with low humidity flows into the HDD 1, so that as a result, the water in the HDD 1 can be removed to the outside. In order to prevent harmful chemical substances from entering when the outside air flows into the HDD 1, a chemical filter 69 may be installed to the outlet hole 64b of the micropump 64 to prevent inflow of the chemical substances.

As described above, according to the dehumidification apparatus 61 in accordance with the present invention, the water in the HDD 1 can be removed efficiently. Also, it can be used in the dehumidification control system in accordance with the present invention shown in FIG. 7. Also, the operation of the micropumps 62 and 64 and the operation of the micropumps 63 and 65 are controlled separately to control the inflow amount of air flowing into the HDD 1 and the outflow amount of air flowing out of the HDD 1, by which the air pressure in the HDD 1 can also be controlled. Further, since the inlet and outlet holes of each of the micropumps are closed in the stopped condition, the airtightness of the HDD 1 is maintained when the dehumidification apparatus 61 is not operated.

Figure 13:
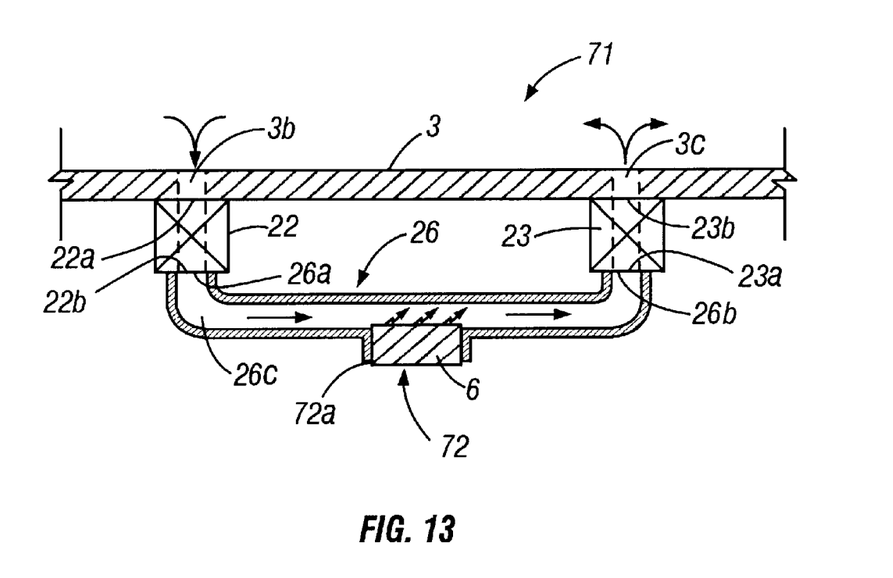
FIG. 13 is a sectional view showing a construction of still another embodiment of a dehumidification apparatus in accordance with the present invention.

FIG. 13 is a sectional view showing a construction of still another embodiment of a dehumidification apparatus in accordance with the present invention. As is apparent from the figure, this dehumidification apparatus 71 has exactly the same construction as that of the dehumidification apparatus 21 shown in FIG. 4 except that the inside air circulation pipe 27 and the micropumps 24 and 25 are eliminated from the dehumidification apparatus 21, and therefore, the detailed description thereof is omitted.

According to the dehumidification apparatus 71, although the dehumidification efficiency somewhat lowers as compared with the dehumidification apparatus 21, the same effects as those of the aforementioned dehumidifier 21 can be achieved in other respects.

Although terms of "upper", "lower", and the like have been used in the explanation of the above described embodiments, these terms have been used for convenience. The absolute positional relationship in the condition in which the apparatus is used is not limited.

Although glass fiber has been used as a capillary member for producing the capillary phenomenon in the above described embodiments, the material is not limited to this, and cotton cloth or the like can be used.

Also, a micropump has been used as an air feed means in the above described embodiments, the air feed means is not limited to this, and a microminiature fan with shutter can be used.

Also, an example in which the dehumidification apparatus 21 provided in the HDD, shown in FIG. 4, is controlled shown as a dehumidification control system is shown in the above described embodiments, the dehumidification control system is not limited to this, and can be configured so as to control the dehumidifier 6 similarly provided in the HDD, shown in FIG. 2, or the dehumidifier 51 shown in FIG. 10.

Also, although an example in which the present invention is applied to an HDD is shown in the above described embodiments, the present invention is not limited to this, and can be applied to an optical disk drive or other precision devices.

Further, although a dehumidifier or a dehumidification apparatus has been installed to a cover in the above described embodiments, various modes are possible; for example, the dehumidifier or the dehumidification apparatus may be installed to a base.

According to the dehumidifier in accordance with the present invention, the water in a closed space can be discharged to the outside with a simple construction.

According to the dehumidification apparatus in accordance with the present invention, the water in a closed space can be discharged to the outside effectively. Also, since the inside air pressure is not decreased by the dehumidification, when the present invention is applied to an HDD, there is no fear of an adverse effect of a flying head etc. on the internal operation. Further, since the inlet and outlet holes of each of the micropumps are closed in the stopped state of the dehumidification apparatus, the airtightness of HDD is maintained.

According to the other dehumidification apparatus in accordance with the present invention, by controlling the inflow amount of air flowing into a closed space and the outflow of air flowing out to the outside, the air pressure in the HDD 1 can also be controlled.

According to the dehumidification control system in accordance with the present invention, the humidity in the HDD or the temperatures inside and outside the HDD are detected, and the operation of dehumidification apparatus is controlled according to the detection result. Therefore, the interior of the HDD can be dehumidified in the best condition.

What is claimed is:

1. A dehumidifier, comprising:
    a plate assembly adapted to be mounted in a wall;
    a capillary member adapted to extend through the wall for forming two separated spaces so that a first portion thereof is mounted on one side of the plate assembly and a second portion thereof is mounted on another side of the plate assembly, and the first and second portions being connected to each other, by which water can be moved between the spaces by capillary action; and
    a heating portion for heating the first portion.

2. The dehumidifier according to claim 1, further comprising a cooling portion for cooling the second portion of the capillary member.

3. A dehumidifier, comprising:
    a capillary member penetrating a wall for forming two separated spaces so that a first portion thereof is located in one space and a second portion thereof is located in the other space, and the first and second portions being connected to each other, by which water can be moved between the spaces by capillary action;
    a heating portion for heating the first portion;
    a cooling portion for cooling the second portion of the capillary member; and wherein
        the heating and cooling portions are heated and cooled, respectively, by the Peltier effect, and located on opposite sides of the wall in the two separate spaces.

4. A disk drive, comprising:
    a substantially closed housing having an opening;
    a plate assembly mounted in the opening of the housing;
    a heating portion mounted to one side of the plate assembly;
    a capillary member mounted to and extending through the housing from said one side of the plate assembly to another side of the plate assembly, by which water can be moved through the capillary member between the sides of the plate assembly by capillary action; wherein the capillary member is heated by the heating portion; and wherein
        a cooling portion is mounted to said another side of the plate assembly so that the capillary member is cooled by the cooling portion.

5. A dehumidifier for removing water from an interior of a disk drive to an exterior of the disk drive, wherein the dehumidifier is mounted to and sealed in an opening in the disk drive, the dehumidifier comprising:
    a heating plate;
    a conductive plate mounted to the heating plate;
    a cooling plate;
    plate terminals mounted to the cooling plate;
    semiconductors extending between the plate terminals and the conductive plate;
    side plates extending between the heating and cooling plates;
    a capillary member mounted to and extending continuously from the heating plate to the cooling plate between the interior and the exterior of the disk drive, wherein the capillary member is sealed so as to maintain airtightness of the disk drive; wherein
        when a voltage is applied between the plate terminals, a current flows in a circuit formed by the terminals, the semiconductors, and the conductive plate, such that the plate terminals are cooled and the conductive plate is heated via the Peltier effect, thereby condensing water in the disk drive on the cooling plate and an interior portion of the capillary member, wherein the condensed water moves successively in the capillary member to an exterior portion of the capillary member by capillary phenomenon, at which point the condensed water is evaporated by the heating plate to the exterior of the disk drive.

6. The dehumidifier of claim 5, wherein the semiconductors are prismatic n-type and p-type semiconductors.

7. The dehumidifier of claim 5, wherein the capillary member is formed from glass fiber.

* * * * *